United States Patent [19]

Slater et al.

[11] Patent Number: 5,939,881

[45] Date of Patent: Aug. 17, 1999

[54] HIGH DYNAMIC RANGE DIGITAL FLUXGATE MAGNETOMETER

[75] Inventors: Eric K. Slater, Long Beach; Kirk K. Kohnen, Fullerton, both of Calif.

[73] Assignee: Raytheon Company, Lexington, Mass.

[21] Appl. No.: 08/968,597

[22] Filed: Nov. 13, 1997

[51] Int. Cl.[6] .............................. G01R 33/04; H03M 1/12
[52] U.S. Cl. ............................................. 324/253; 341/155
[58] Field of Search ..................................... 324/253, 254, 324/255; 341/155, 158, 163

[56] References Cited

U.S. PATENT DOCUMENTS 4,677,381  6/1987  Geerlings ................................. 324/254

*Primary Examiner*—Walter E. Snow
*Attorney, Agent, or Firm*—Colin M. Raufer; Leonard A. Alkov; Glenn H. Lenzen, Jr.

[57] ABSTRACT

An improved digital fluxgate magnetometer that uses digital logic and a high resolution digital to analog converter to digitize a magnetic signal for use by signal processing algorithms. The magnetometer includes an oscillator that outputs an oscillator signal and a magnetic fluxgate sensor having a drive coil coupled to the oscillator, a feedback coil, and a sense coil. An analog multiplier is coupled to the sense coil and the oscillator and outputs a signal to an analog low pass filter. A comparator is coupled to the analog multiplier, and a register is coupled to the comparator and outputs a logical 1 or a logical 0 in accordance with the output of the comparator. A digital filter receives the output of the register and produces a digital output of the digital fluxgate magnetometer. A high resolution digital to analog converter is coupled between the register and the feedback coil of the magnetic fluxgate sensor in a feedback loop of the sensor. The digital to analog converter produces a very high resolution digitized output (typically >22 bits) that is necessary to adequately represent the dynamic range of the sensor.

7 Claims, 2 Drawing Sheets

HIGH DYNAMIC RANGE DIGITAL FLUXGATE MAGNETOMETER

BACKGROUND

The present invention relates generally to magnetometers, and more particularly, to an improved digital fluxgate magnetometer.

The assignee of the present invention designs and manufactures magnetic sensor systems that process data from three-axis fluxgate magnetometer sensors using a variety of magnetic data processing algorithms. Such magnetic data processing algorithms are disclosed in U.S. Pat. No. 5,239,474, entitled "Dipole Moment Detection and Localization", U.S. patent application Ser. No. 08/6111,291, filed Mar. 5, 1996, entitled "Improved Dipole Moment Detector and Localizer", and U.S. patent application Ser. No. 08/611,352, filed Mar. 5, 1996, entitled "Spatial Temporal Processing of Magnetometer Data to Localize Magnetic Dipoles". Present state of the art fluxgate magnetometer sensors use the output of an analog integrator as the magnetometer output. This signal is then digitized with an analog to digital (A/D) converter having a large number of bits of resolution (typically >20). This requires the use of large, expensive, and power hungry analog to digital converters that are presently limited to around 22 bits resolution.

These prior art magnetic sensor systems use an analog magnetic fluxgate sensor, and couple it to a high resolution analog to digital converter to produce a digital output. This approach has a number of disadvantages. The high resolution A/D converters tend to be limited in dynamic range, presently to 22 bits or less. The high resolution A/D converters are expensive. The high resolution A/D converters are physically large. The high resolution A/D converters consume large amounts of power. Furthermore, the analog integrators used in the analog fluxgate sensors cause low level drift in the output signal of the sensor which limits their use in detection and tracking targets.

A stopgap measure presently utilized by the assignee of the present invention to overcome the limitations of the above-described conventional fluxgate magnetometer sensors is to use an adjustable voltage reference and an analog subtractor to subtract (remove) the large constant part of the measured magnetic field due to the earth's magnetic field from the magnetic field measured by the fluxgate magnetometer. Then, the remaining signal is digitized using a reduced resolution analog to digital converter (12 to 16 bits). This technique only works in applications in which the magnetometer sensor is stationary with respect to the earth's magnetic field. Alternative approaches for providing high resolution digitization for fluxgate magnetometer sensors are described in U.S. patent application Ser. No. 08/636,617, filed Apr. 23, 1996, entitled "Digital Flux Gate Magnetometer", and U.S. Pat. No. 5,652,512 entitled "Advanced Digital Flux Gate Magnetometer".

Accordingly, it is an objective of the present invention to provide for a digital fluxgate magnetometer that improves upon the above-described conventional analog magnetometers.

SUMMARY OF THE INVENTION

To accomplish the above and other objectives, the present invention provides for an improved digital fluxgate magnetometer sensor that uses digital logic and a high resolution digital to analog converter to digitize a magnetic signal for use by signal processing algorithms. By incorporating the high resolution digital to analog converter directly in a feedback loop of the sensor, a precision (and expensive) analog to digital converter is replaced by a less expensive, lower power digital to analog converter. Also, the present digital fluxgate magnetometer sensor does not drift, as is a common problem in conventional magnetometer sensors that employ analog integrators that drift.

More specifically, the digital fluxgate magnetometer uses digital logic and a high resolution digital to analog converter to digitize a magnetic signal used by signal processing algorithms. The magnetometer includes an oscillator that outputs an oscillator signal and a magnetic fluxgate sensor having a drive coil coupled to the oscillator, a feedback coil, and a sense coil. An analog multiplier is coupled to the sense coil and the oscillator and outputs a signal to an analog low pass filter. A comparator is coupled to the analog multiplier, and a register is coupled to the comparator and outputs a logical 1 or a logical 0 in accordance with the output of the comparator. A digital filter processes the output of the register to produce a digital output of the magnetometer. A high speed digital clock couples clock signals to the register and the digital filter. A high resolution digital to analog converter is coupled between the register and the feedback coil of the magnetic fluxgate sensor in a feedback loop of the sensor.

The present invention is a fluxgate magnetometer that produces a very high resolution digitized output. This high precision (typically >22 bits) is necessary to adequately represent the dynamic range of the sensor. The present invention decreases the power consumption of the magnetometer compared to conventional analog magnetometers by replacing the high resolution (typically >20 bits) analog to digital converter with a similarly sized digital to analog converter, which consumes less power.

The present invention eliminates low frequency circuit noise and drift caused by imperfect analog integrators typically used in fluxgate magnetometer sensors. The present invention decreases the size of the magnetometer compared to conventional analog magnetometer sensors, since high resolution analog to digital converters are considerably larger than comparable high resolution digital to analog converters.

The present invention mitigates the drawbacks of conventional analog magnetometer sensors discussed in the Background section. The present invention processes vector magnetic field values (which are useful in determining the heading of the sensor, and are required for many magnetic signal processing algorithms), and which data are lost during processing by conventional AC coupled digitization of analog magnetometer sensors. The present invention minimizes distortion (due to high pass filtering) of the low frequency waveforms. Such distortion adversely impacts the performance of magnetic processing algorithms. The present invention dynamically measures the magnetic field even as it is rotated with respect to the field.

The present invention may be used in harbor and port defense applications, for example. The techniques of the present invention may also used to provide inertially stabilized fluxgate vector sensors for moving platforms such as buoys, underwater vehicles (including torpedoes), aircraft and land based vehicles.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
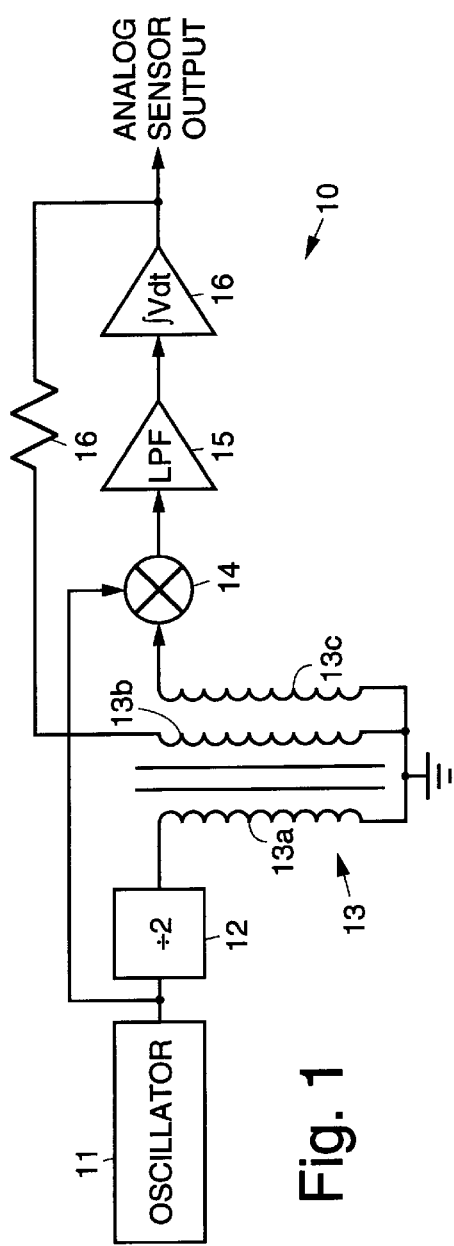
FIG. 1 is a diagram illustrating a conventional analog magnetometer.

The present invention is an improvement over magnetometers designed using conventional analog magnetic fluxgate sensor technology. Referring to the drawing figures, FIG. 1 is a block diagram illustrating a conventional analog magnetometer 10 that will be described to provide a better understanding of the present invention. The conventional analog magnetometer 10 comprises an oscillator 11 whose signal output is coupled by way of a frequency divider 12 (divide by two circuit) to a drive coil 13a of a magnetic fluxgate sensor 13. The magnetic fluxgate sensor 13 also comprises a feedback coil 13b and a sense coil 13c. The sense coil 13c is coupled to a first input of an analog multiplier 14 whose second input is coupled to the output of the oscillator 11 and receives the oscillator signal. An output of the analog multiplier 14 is filtered by a low pass filter 15 and then integrated by an integrator 16 which produces a signal output of the conventional analog magnetometer 10. The signal output from the integrator 16 is fed back through a resistor 17 to the feedback coil 13b of the magnetic fluxgate sensor 13.

In the conventional analog magnetometer 10, the oscillator 11 generates the oscillator signal. The frequency of the oscillator signal is divided by 2 in the frequency divider 12 and used to drive the core material of the magnetic fluxgate sensor 13. The core material is a magnetically saturatable material that is driven into a saturated state twice with each two cycles of the low pass filter signal waveform.

The nature of the core material is such that if it is in a magnetic field, the sense coil 13c detects an AC signal at twice the drive frequency. This AC signal is multiplied (in the analog domain) by the analog multiplier 14 with twice the drive coil frequency thereby frequency shifting the signal down to DC.

This DC signal appropriately filtered by the low pass filter 15, represents the difference in magnetic field seen by the core material of the magnetic fluxgate sensor 13 due to the ambient field (the field being sensed) and the magnetic field induced by the feedback coil 13b. Because the feedback and sense coils 13b, 13c operate at different frequencies, in some sensor implementations they are the same coil appropriately coupled to the other circuitry of the sensor 10. Thus, the integrator 16 corrects the drive to the feedback coil 13b to keep the output of the analog multiplier 14 and low pass filter 15 (and therefore the magnetic field as seen by the core material of the magnetic fluxgate sensor 13) as close to zero as possible.

When the analog magnetometer 10 is in equilibrium, the output of the integrator 16 is a signal equal and opposite to the magnetic field being measured by the core material of the magnetic fluxgate sensor 13. The output signal of the analog magnetometer 10 is taken from this point, after the integrator 16.

For many applications, the output signal is then digitized to provide a high resolution (often >20 bits) digital signal. This digitization requires an expensive analog to digital converter. The present invention provides an improved digital fluxgate magnetometer that directly supplies a digital output signal without requiring the expensive analog to digital converter used in conventional analog fluxgate magnetometers.

Figure 2:
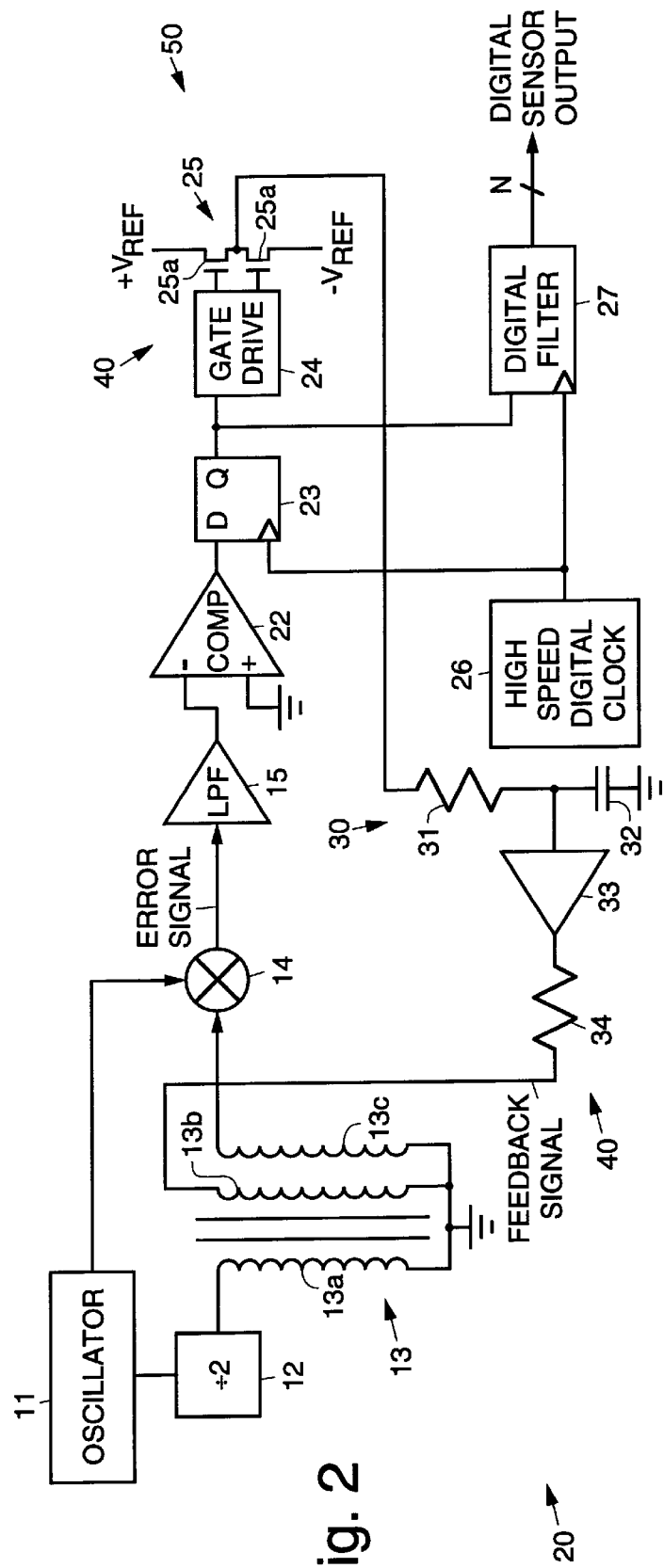
FIG. 2 is a diagram illustrating an embodiment of a digital fluxgate magnetometer in accordance with the principles of the present invention.

Referring now to FIG. 2, it is a block diagram illustrating an embodiment of a digital fluxgate magnetometer 20 in accordance with the principles of the present invention that employs an improved analog to digital converter 50 in accordance with the principles of the present invention. The digital fluxgate magnetometer 20 comprises an oscillator 11 that outputs an oscillator signal that is coupled by way of a frequency divider 12 (divide by two circuit) to a drive coil 13a of a magnetic fluxgate sensor 13. The magnetic fluxgate sensor 13 also comprises a feedback coil 13b and a sense coil 13c. The sense coil 13c is coupled to a first input of an analog multiplier 14 whose second input is coupled to the output of the oscillator 11 and receives the oscillator signal. An output of the analog multiplier 14 is coupled to an analog low pass filter (LPF) 15 whose output is coupled to a first input of a comparator (COMP) 22. A second input of the comparator 22 is connected to ground.

An output of the comparator 22 is coupled to a register 23 that outputs a logical 1 or a logical 0 depending upon the output of the comparator 22. The signal output of the register 23 is coupled to a digital filter 27 that produces a digital sensor output of the digital fluxgate magnetometer 20. A high speed digital clock 26 has its clock signal output coupled to clock inputs of the register 23 and the digital filter 27, and appropriately clocks the signals through the respective circuits.

The signal output from the register 23 is coupled to a high resolution digital to analog converter 40 that is disposed in a feedback loop between the register 23 and the feedback coil 13b of the magnetic fluxgate sensor 13. The high resolution digital to analog converter 40 comprises a gate drive circuit 24, a switch circuit 25, a low pass filter 30, and a buffer amplifier 33.

More specifically, the signal output from the register 23 is coupled to the gate drive circuit 24. Outputs of the gate drive circuit 24 are coupled to gates of field effect transistors (FETs) 25a that comprise analog switches 25a of the switch circuit 25. The output of the switch circuit 25 is coupled to the low pass filter 30 (RC network) comprising a resistor 31 that is serially coupled through a capacitor 32 to ground. The low pass filter 30 filters the output of the switch circuit 25. This filtered signal is coupled through the buffer amplifier 33 and a feedback resistor 34 (as required) to the feedback coil 13b of the magnetic fluxgate sensor 13.

The heart of the digital fluxgate magnetometer 20 is an analog to digital converter 50 that, in the embodiment shown in FIG. 2, includes the comparator 22, the register 23, the high resolution digital to analog converter 40, the low pass filter 30, the high speed digital clock 26 and the digital filter 27. The improved analog to digital converter 50 accurately converts the error signal into an analog feedback signal for nulling the sensor 13 and produces the high resolution digital output signal that corresponds to the output of the sensor 13.

In the present digital fluxgate magnetometer 20, the analog integrator 15 used in the conventional analog fluxgate magnetometer 10 is replaced by the analog low pass filter 15 and the comparator 22. The comparator 22 determines whether a low pass filtered error signal output from the analog low pass filter 15 is positive or negative, and outputs a digital logic signal accordingly. The register 23 coupled to the output of the comparator 22 outputs a logical 1 or a logical 0 depending upon the output of the comparator 22. The output of the comparator 22 drives gates of the transistors 25a (analog switches 25a) of the switch circuit 25.

The register 23 and the digital filter 27 are clocked by the high speed digital clock 26 at a frequency that is higher than the frequency of the oscillator signal output from the oscillator 11 that feeds the drive coil 13a by way of the frequency divider 12 and analog multiplier 14. A stream of binary data is sent to the gate drive circuit 24 that is coupled to gates of the analog switches 25a and digital filter 27. The gate drive circuit 24 determines, based on the output of the register 23, how to drive the field effect transistors 25a to either apply a positive or a negative reference voltage to the low pass filter 30 comprising a resistor 31 and a capacitor 32. The low pass filter 30 (resistor 31 and capacitor 32) filters the output produced by the field effect transistors 25. This filtered signal is buffered by the buffer amplifier 33 and used to drive the feedback coil 13b of the magnetic fluxgate sensor 13.

The output of the register 23 is also input to the digital filter 27. A first stage of the digital filter 27, clocked by the same clock signal fed to the register 27, simulates the frequency response of the feedback resistor 31 and capacitor 32 of the low pass filter 30, thereby providing a digital replica of the current driving the feedback coil 13b. Subsequent stages of the digital filter 27 further low pass filter the digital data to eliminate signals that are outside the frequency band of interest. These later digital filter stages may but do not necessarily operate at the same frequency as the first stage of the digital filter 27 and the oscillator 11. The ultimate output of the digital filter 27 is an N bit binary word (typically N>24 bits) that is the digital output of the magnetometer 20.

As the measured magnetic signal changes, the output of the low pass filter 15 becomes nonzero. The comparator 22 converts this output signal to a digital value that is then passed to the register 23. The output of the register 23, by favoring one state for a relatively long period of time, causes the gate drive circuit 24 to favor outputting one of two possible reference voltages ($+V_{ref}$, $-V_{ref}$). This causes the voltage on the capacitor 32 to change, and therefore the current through the feedback coil 13b to change. During proper operation of the magnetic fluxgate sensor 13, this feedback current change forces the output of the low pass filter 30 back towards zero.

In addition, the output of the register 23 is sent to the digital filter 27 during this time. The stream of binary data causes the output of the digital filter 27 to change in a manner that tracks the voltage on the capacitor 32 in the low pass filter 30 (and hence the current in the feedback coil 13b). After the additional filtering in the digital filter 27 to remove high frequency components of the signal, the digital filter 27 outputs a digitized version of the current in the feedback coil 13b. This digital signal is the digital output of the magnetometer 20.

In an ideal case when the magnetic fluxgate sensor 13 is in equilibrium, the output of the comparator 22 dithers between a high and low voltage outputs. The register 23 outputs a signal that approximates a square wave with a duty cycle related to the magnetic field as seen by the magnetic fluxgate sensor 13. The low pass filter 30 takes this signal, and converts it to the drive current that is supplied to the feedback coil 13b. The digital filter 27 also processes this same signal, and converts it to the high resolution digital representation of the current in the feedback coil 13b to provide the output signal from the digital fluxgate magnetometer 20.

Figure 3:
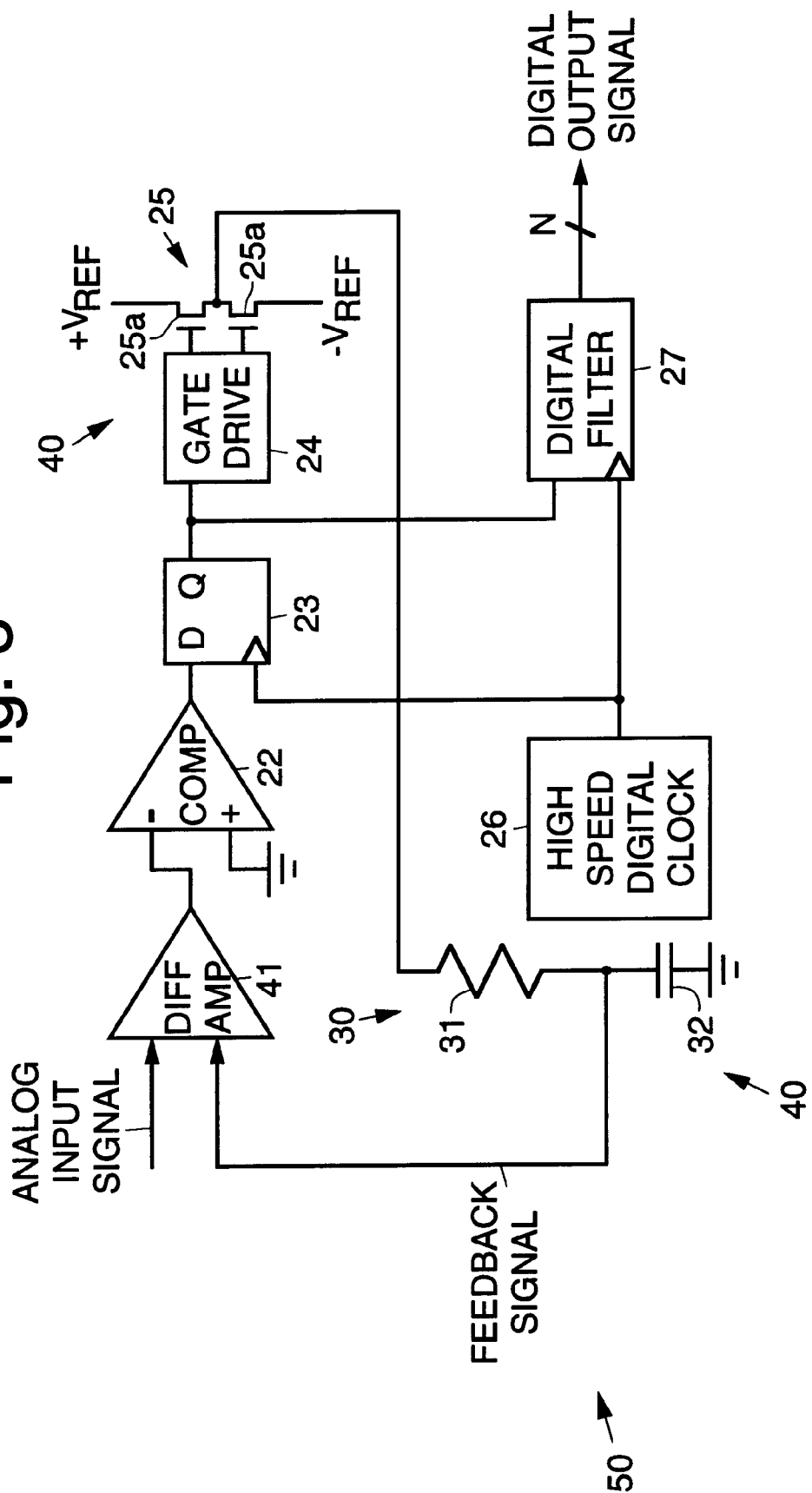
FIG. 3 illustrates an embodiment of an analog to digital converter in accordance with the principles of the present invention.

Although the analog to digital converter 50 has been described with regard to its use with a magnetometer 13, it is to be understood that it may be used with any sensor that employs feedback nulling and requires a large dynamic range, such as certain types of accelerometers and other types of magnetometers. Furthermore, the analog to digital converter 50 may be used as a stand-alone circuit for digitizing an analog input signal. FIG. 3 illustrates an embodiment of an analog to digital converter 50 in accordance with the principles of the present invention.

Referring to FIG. 3, an exemplary analog to digital converter 50 comprises a differential amplifier 41 whose first input receives an analog input signal that is to be digitized. The analog to digital converter 50 further comprises the comparator 22, the register 23, the high resolution digital to analog converter 40, the high speed digital clock 26 and the digital filter 27, as were discussed with reference to FIG. 2. The output of the digital to analog converter 40 comprises a feedback signal that is coupled to a second input of the differential amplifier 41. The analog to digital converter 50 accurately replicates the analog input signal to produce the high resolution digital output signal that corresponds to the analog input signal, and also converts this digital signal into an analog feedback signal for input to the second input of the differential amplifier 41.

Thus, an improved digital fluxgate magnetometer has been disclosed. It is to be understood that the described embodiment is merely illustrative of some of the many specific embodiments that represent applications of the principles of the present invention. Clearly, numerous and other arrangements can be readily devised by those skilled in the art without departing from the scope of the invention.

What is claimed is:

1. Sensing apparatus comprising:
    a sensor comprising a feedback input, and a sense output that outputs an error signal indicative of the difference between a signal sensed by the sensor and a feedback signal input to the feedback input;
    a comparator coupled to the sense output of the sensor;
    a register coupled to the comparator that outputs a logical 1 or a logical 0 in accordance with the output of the comparator;
    a digital filter coupled to the signal output of the register, for producing a digital output of the sensing apparatus;
    a digital clock having a clock signal output coupled to clock inputs of the register and the digital filter; and
    a high resolution digital to analog converter and analog low pass filter coupled between the register and the feedback input of the sensor for supplying the feedback signal thereto.

2. The sensing apparatus of claim 1 wherein the sensor comprises a magnetic fluxgate sensor comprising core material, a drive coil, a feedback coil, and a sense coil, and wherein the sensing apparatus further comprises an oscillator that outputs an oscillator signal that is coupled to the drive coil, and an analog multiplier coupled to the sense coil and the oscillator for generating the error signal.

3. The sensing apparatus of claim 1 wherein the high resolution digital to analog converter comprises
    a switch circuit comprising a plurality of analog switches;
    a gate drive circuit coupled between the register and gates of the analog switches;
    a low pass filter coupled to the switch circuit for filtering error output signals output therefrom; and
    a buffer amplifier coupled between the low pass filter and the feedback coil of the magnetic fluxgate sensor.

4. A digital fluxgate magnetometer comprising:

an oscillator that outputs an oscillator signal;

a magnetic fluxgate sensor comprising core material, a drive coil, a feedback coil, and a sense coil, and wherein the oscillator is coupled to the drive coil;

an analog multiplier having inputs coupled to the sense coil and the oscillator;

an analog low pass filter coupled to an output of the analog multiplier;

a comparator having a first input coupled to the low pass filter and having a second input coupled to ground;

a register coupled to the comparator that outputs a logical 1 or a logical 0 in accordance with the output of the comparator;

a digital filter coupled to receive the signal output of the register for producing a digital output of the digital fluxgate magnetometer;

a high speed digital clock having a clock signal output coupled to clock inputs of the register and the digital filter; and a high resolution digital to analog converter coupled between the register and the feedback coil of the magnetic fluxgate sensor.

5. The magnetometer of claim 4 wherein the high resolution digital to analog converter comprises a switch circuit comprising a plurality of analog switches;

a gate drive circuit coupled between the register and gates of the analog switches;

a low pass filter coupled to the switch circuit for filtering error output signals output therefrom; and a buffer amplifier coupled between the low pass filter and the feedback coil of the magnetic fluxgate sensor.

6. An analog to digital converter comprising:

a differential amplifier having a first input for receiving an analog input signal that is to be digitized;

a comparator coupled to the differential amplifier;

a register coupled to the comparator that outputs a logical 1 or a logical 0 in accordance with the output of the comparator;

a high resolution digital to analog converter coupled between the register and a second input of the differential amplifier for supplying a feedback signal thereto;

a digital filter coupled to the signal output of the register, for producing a digital output signal corresponding to the analog input signal; and a digital clock having a clock signal output coupled to clock inputs of the register and the digital filter.

7. The analog to digital converter of claim 6 wherein the high resolution digital to analog converter comprises a switch circuit comprising a plurality of analog switches;

a gate drive circuit coupled between the register and gates of the analog switches; and a low pass filter coupled to the switch circuit.

\* \* \* \* \*